United States Patent [19]
Anderson

[11] Patent Number: 5,987,085
[45] Date of Patent: Nov. 16, 1999

[54] CLOCK RECOVERY CIRCUIT

[75] Inventor: Michael B. Anderson, Colorado Springs, Colo.

[73] Assignee: LSI Logic Coporation, Milpitas, Calif.

[21] Appl. No.: 08/824,170

[22] Filed: Mar. 26, 1997

[51] Int. Cl.$^6$ ..................................................... H03D 3/24
[52] U.S. Cl. ......................... 375/374; 375/375; 375/376; 331/10; 331/25; 327/157
[58] Field of Search ..................................... 375/374, 375, 375/376; 331/57, 10, 1 R, 11, 25, 1 A; 328/155, 63, 133, 134, 138; 327/147, 148, 150, 151, 156, 157

[56] References Cited

U.S. PATENT DOCUMENTS

| | | | |
|---|---|---|---|
| 3,878,334 | 4/1975 | Halpern | 325/346 |
| 4,069,462 | 1/1978 | Dunn . | |
| 4,222,013 | 9/1980 | Bowers et al. | 331/1 A |
| 4,419,760 | 12/1983 | Bjornholt | 375/120 |
| 4,464,771 | 8/1984 | Sorensen | 375/120 |
| 4,534,044 | 8/1985 | Funke et al. | 360/51 |
| 4,876,518 | 10/1989 | Perkins . | |
| 4,876,700 | 10/1989 | Grindahl | 375/87 |
| 4,926,447 | 5/1990 | Corsetto et al. | 375/120 |
| 5,164,966 | 11/1992 | Hershberger | 375/110 |
| 5,170,297 | 12/1992 | Wahler et al. | 360/51 |
| 5,276,712 | 1/1994 | Pearson | 375/110 |
| 5,278,874 | 1/1994 | Liu et al. . | |
| 5,432,481 | 7/1995 | Saito | 331/45 |
| 5,487,093 | 1/1996 | Adresen et al. . | |

OTHER PUBLICATIONS

M. Carnes et al., "Cycle Synchronized Phase Locked Loop"; IBM Technical Disclosre Bulletin; vol. 23, No. 1; Jun. 1, 1980; New York; pp. 81–82.

*Primary Examiner*—Don N. Vo
*Attorney, Agent, or Firm*—Duke W. Yee; Wayne P. Bailey

[57] ABSTRACT

A phase locked loop, which does not require a local reference clock to obtain a frequency lock. The circuit includes a frequency locked loop and a phase locked loop in which the frequency locked loop does not require a local reference clock. The frequency locked loop includes a transition counter having an input for data with an output connected to a charge pump. This charge pump is connected to a loop filter, which in turn is connected to a voltage controlled oscillator. The output of the voltage controlled oscillator is connected to a second input in the transition counter. The phase locked loop includes a phase detector with an input for data. The output of this phase detector is connected to a second charge pump, which has it output connected to the loop filter. The output of the voltage controlled oscillator also is connected to the input of the phase detector.

23 Claims, 4 Drawing Sheets

CLOCK RECOVERY CIRCUIT

BACKGROUND OF THE INVENTION

1. Technical Field

The present invention relates generally to digital data transmission and in particular to a method in apparatus for recovering a clock signal. Still more particularly, the present invention relates to a phase locked loop circuit in which a reference clock is absent.

2. Description of the Related Art

Services such as voice mail, video on demand, and voice activated accessing of information from remote text and video libraries across the country are being made available over the internet and through other sources through various broad band technologies. These services are made available through components such as synchronous optical network (SONET), a synchronous transfer mode (ATM) and intelligent networks (IN) that are found in broad band communications systems. Other services include computer serial input/output (I/O) data channels such as Fibre Channel and serial storage architecture (SSA). These services are provided through a communications network containing a system of interconnected facilities designed to carry traffic from a variety of telecommunications sources. A "network" includes nodes and links. "Nodes" are typically switching offices, junction pairs, both. "Links" represent cable, terminating equipment, etc. "Traffic" is information within the network that flows through the nodes and links. With the introduction of more sophisticated services involving the transfer of large amounts of information, such as digital data, video, or voice data, communications networks must provide certain levels of performance.

As the speed of serial data links and communications networks increase, the quality of the data must be maintained. For example, jitter and signal amplitude may cause intersymbol interference (ISI). "Jitter" is a term which refers to a type of signal distortion in serial data communications. More specifically, jitter can be described as incidental phase modulation measured as a time deviation. Typical bit error rates (BERs) are acceptable to an order of $10^{-12}$. Transmitters with low jitter output and sensitive receivers are required in serial data links to achieve acceptable levels of BER in communications networks. Additionally, repeaters are used to regenerate the amplitude with the signal providing the ability to transmit the data across the additional lengths of cable, allowing quality transmission over longer distances. Additionally, repeaters are employed to remove jitter caused by ISI. A component found in many repeaters is a phase locked loop (PLL) circuit, which is used to provide a recovered clock signal to re-time data going through a repeater. Many phase locked loop circuits employ a reference clock as an input to the repeater. The reference clock usually consist of an expensive crystal oscillator, which is used only for a short period of time to obtain frequency lock within the clock recovery PLL. Once frequency lock is obtained, the reference clock is no longer used by the repeater circuit.

In FIG. 1, repeater circuit 100 includes an amplifier 102, a D flip-flop 104, a clock recovery PLL 106 and a reference clock 108. Data is input into amplifier 102, which regenerates the amplitude of the data signal. This data is sent to D flip-flop 104 and clock recovery PLL 106. Reference clock 108 is employed to obtain frequency lock when the circuit is started. Thereafter, clock recovery PLL 106 generates a recovered clock signal, which is input into D flip-flop 104 as a clock signal that re-times data output from D flip-flop 104.

In reducing costs of PLLs and repeaters, it would be desirable to have an improved clock recovery apparatus that eliminates the requirements of a reference clock using a crystal oscillator.

SUMMARY OF THE INVENTION

The present invention provides a phase locked loop, which does not require a local reference clock to obtain a frequency lock. The circuit includes a frequency locked loop and a phase locked loop in which the frequency locked loop does not require a local reference clock. The frequency locked loop includes a transition counter having an input for data with an output connected to a charge pump. This charge pump is connected to a loop filter, which in turn is connected to a voltage controlled oscillator. The output of the voltage controlled oscillator is connected to a second input in the transition counter. The phase locked loop includes a phase detector with an input for data. The output of this phase detector is connected to a second charge pump, which has its output connected to the loop filter. The output of the voltage controlled oscillator also is connected to the input of the phase detector.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 2:
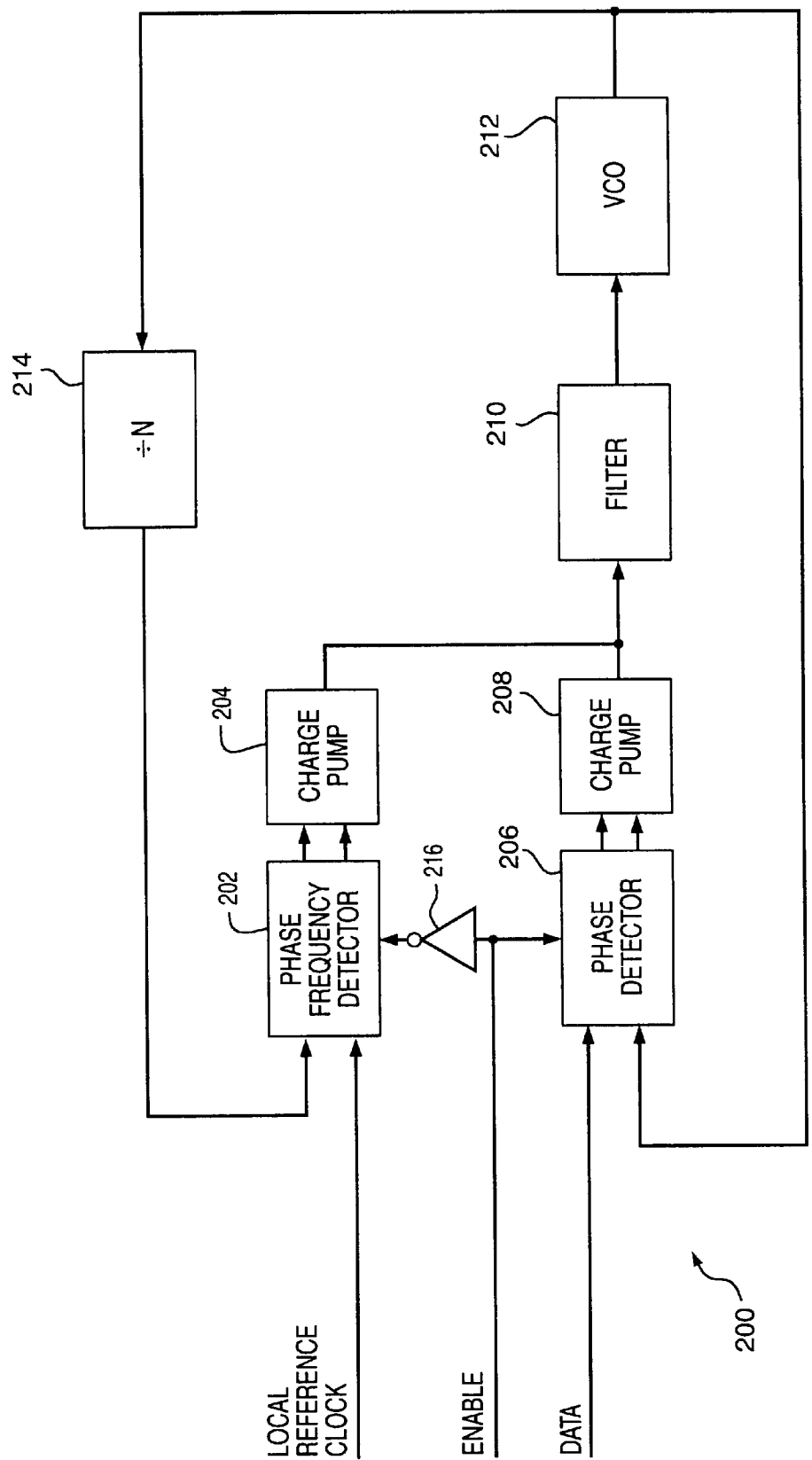
FIG. 2 is a schematic diagram of a phase locked loop circuit known in the art.

FIG. 2 is a schematic diagram of a phase locked loop (PLL) circuit 200 known in the art. PLL 200 is an analog clock recovery PLL, which requires a local reference clock. PLL circuit 200 includes a phase frequency detector 202, a charge pump 204, a phase detector 206, a charge pump 208, a filter 210, a voltage controlled oscillator (VCO) 212, and a divide by N circuit 214. Phase frequency detector 202 includes an input connected to a local reference clock and a second input connected to the output divide by N circuit 214. Phase frequency detector 202 is employed to compare the clock signal generated by VCO 212 and is modified by divide by N circuit 214 with a local reference clock to provide an output to charge pump 204, which is used to increase or decrease the rates of clock signal from VCO 212. VCO 212 is an oscillator whose frequency can be controlled by phase frequency detector 202 or phase detector 206 through either charge pump 204 or charge pump 208.

Phase frequency detector 202 is enabled by an enable signal through inverter 216 until a frequency lock occurs. At that time, the enables signal disables phase frequency detector 202 and enable phase detector 206. Phase detector 206 has an input for receiving data and a second input for receiving feedback from VCO 212. Phase detector 206 alters the frequency of VCO 212 through charge pump 208.

Filter 210 is employed to filter out different components resulting from interfering signals far away from the center of frequency of interest. Additionally, filter 210 also provides a memory for the loop in case lock is momentarily lost due to a large interfering transient.

Phase detector 206 produces pulses proportional to the phase difference between the incoming data and the output of VCO 212. This phase-sensitive signal is then passed to loop filter 210 through charge pump 208 and applied to the control input of VCO 212. For example, if the frequency shifts slightly, the phase difference between the signal from VCO 212 and the data signal will begin to increase with time. This would change the control voltage on VCO 212 in such a way to bring the frequency of VCO 212 back to the same value as the incoming data signal. As a result, PLL circuit 200 is able to maintain a lock when the input signal frequency changes and the VCO input voltage is proportional to the frequency of the incoming signal. The range of input signal frequencies over which the PLL can maintain a lock is called the "lock range". A drawback to PLL circuit 200 is the requirements to a local reference clock. Typically, the local reference clock includes an expensive crystal oscillator, which is only used for a short period of time when PLL 200 is started to obtain a frequency lock. Thereafter, the local reference clock is no longer required.

Figure 3:
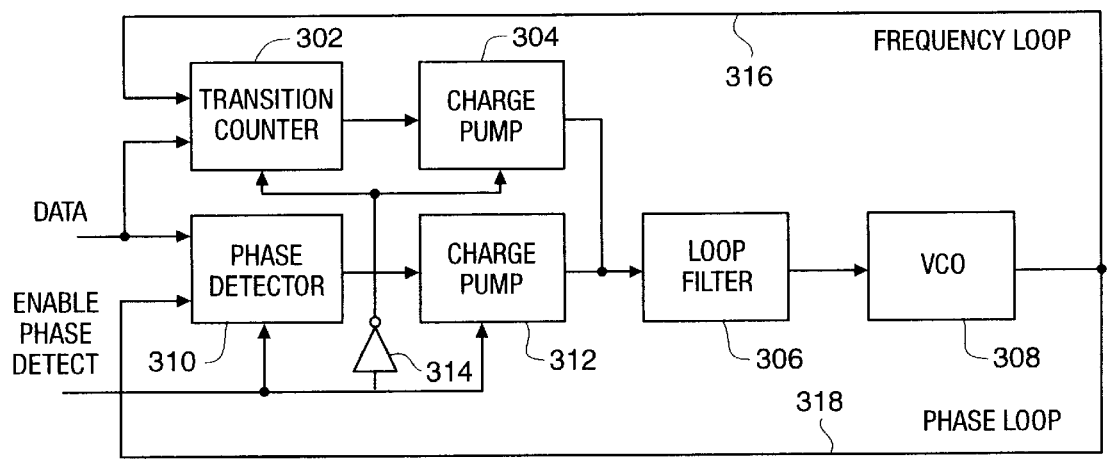
FIG. 3 is a functional block diagram of a phase locked loop circuit according to the present invention.

In FIG. 3, a functional block diagram of a phase locked loop (PLL) circuit 300 is depicted according to the present invention. In the depicted example, PLL circuit 300 is a clock recovery PLL circuit that does not require a local reference clock. PLL circuit 300 includes a transition counter 302, a charge pump 304, a loop filter 306, a voltage control oscillator (VCO) 308, a phase detector 310, a charge pump 312, and an inverter 314. Charge pump 304 and charge pump 312 form a charge pump unit in the depicted example. Alternatively, a single charge pump may be used in place of charge pump 304 and 312 in which the charge pump has an input for both transition counter 302 and phase detector 310. A frequency locked loop 316 is formed by transition counter 302, charge pump 304, loop filter 306, and VCO 308. A phase locked loop 318 in PLL is formed by phase detector 310, charge pump 312, loop filter 306, and VCO 308. Frequency locked loop 316 and phase locked loop 318 are enabled and disabled by a signal, enable phase detect, which enable and disables transition counters 302, charge pump 304, phase detector 310, and charge pump 312. Inverter 314 results in transition counter 302 and charge pump 304 being enabled when phase detector 310 and charge pump 312 are disabled and vise versa. In this manner, only frequency locked loop 316 or phase locked loop 318 is active at any one time.

Transition counter 302 is a counter or counting means that includes an input for data along with a second input connected to VCO 308. The function of transition counter 302 is to detect and compare the number of clock cycles generated by VCO 308 and the number of positive and/or negative transitions from the serial data stream input into transition counter 302. Similarly, phase detector 310 includes a first input for data and a second input connected to the output of VCO 308. When the frequency locked loop is enabled, VCO 308 is an output means controlled by transition counter 302 through charge pump 304 and loop filter 306. Loop filter 306 is employed to filter out different components resulting from interfering signals far away from the center of the frequency. Additionally, loop filter 306 provides a memory for either loop in case a lock is momentarily lost due to a large interfering transient in the signal input into PLL circuit 300. Frequency locked loop 316 is disabled once frequency lock is acquired and at that time phase locked loop 318 is enabled. Transition counter 302 receives transitions from the data signal and compares these transitions to the number of clock signals to make a decision whether to pump charge up or down in charge pump 304. This occurs while phase detector 310 and charge pump 312 are disabled. Once frequency lock is achieved, phase detector 310 and charge pump 312 are enable and transition counter 302 and charge pump 304 are disabled.

In the depicted example, the data signal used to obtain frequency lock through the frequency locked loop is an idle character that is repeatedly transmitted on the link. In Fibre channel applications, the idle character, also referred to as an "idle primitive", is repeatedly sent while the serial links initialize and when no data is being sent. Since the idle character is deterministic, the exact frequency information may be obtained from this idle character. In other words, since it is known how many transitions occur, the number of cycles the recovery PLL has and obtained an estimate of relative frequency of the recovery PLL. This information is fed back to the recovery PLL, which then adjusts its frequency towards the frequency of the data, the idle characters. The frequency locked loop in the depicted example serves a course adjustment that moves the recovery PLL close enough to the frequency of the data such that phase lock can occur.

For example, for Fibre Channel, the idle primitive occurs with 16 positive and 16 negative transitions over 40 bit times or clock cycles. If the transition counter identifies less than 16 positive and negative transitions, the charge pump 304 would be instructed to add charge to filter 306. As a result, the frequency of VCO 308 is increased. If transition counter 302 identifies more than 16 positive and negative transitions within 40 clock cycles, charge pump 304 would be instructed to decrease the charge in loop filter 306, thus reducing the frequency of the output from VCO 308. In this manner, frequency lock is obtained from a data stream without the need for a reference clock.

Figure 4:
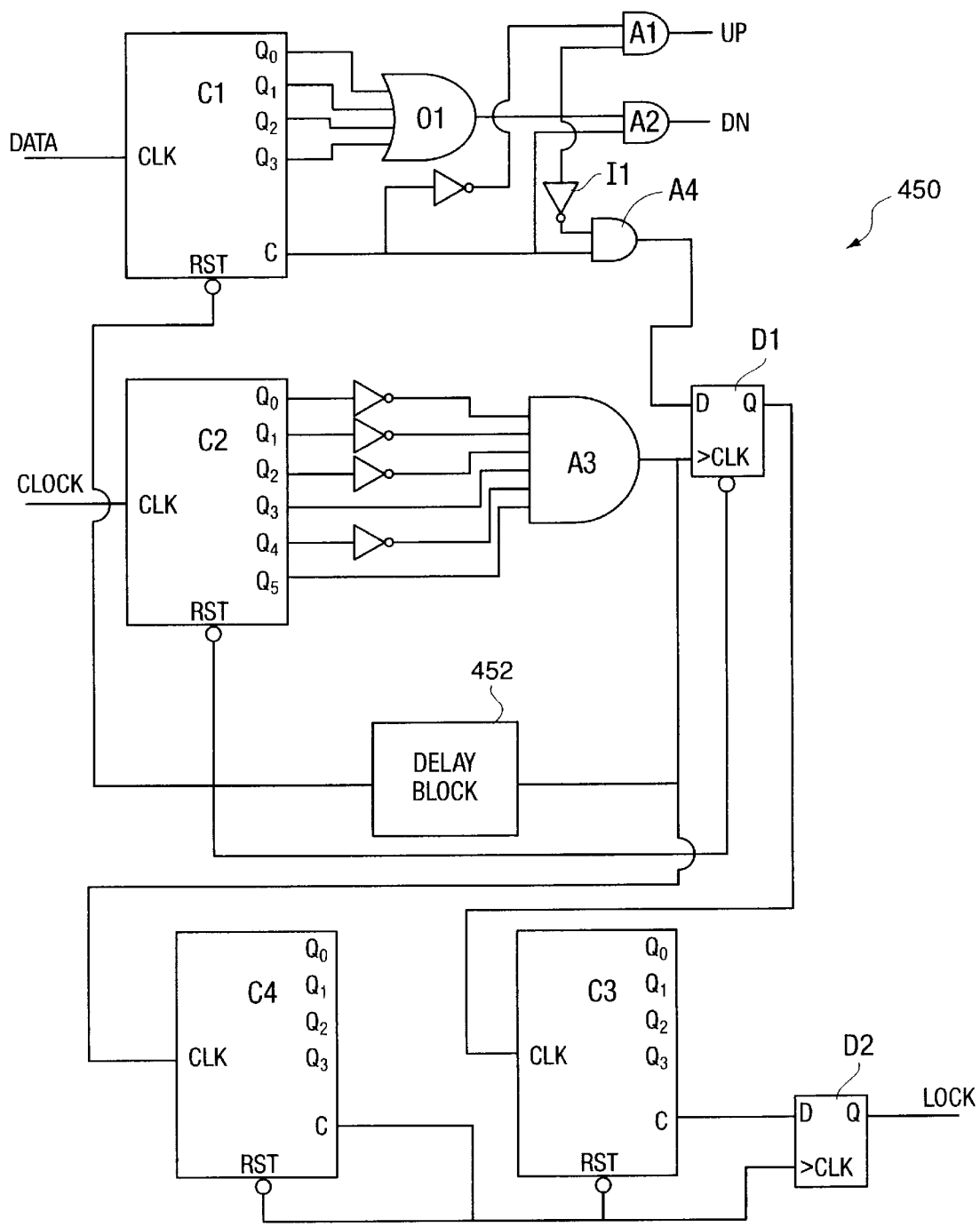
FIG. 4 is a block diagram of a transition counter according to the present invention.

Turning to FIG. 4, a block diagram of a transition counter 450 is depicted according to the present invention. Transition counter 450 is a more detailed block diagram of transition counter 302 in FIG. 3. Transition counter 450 includes a counter C1, which is a sixteen bit counter used to counter positive edge transitions. When exactly sixteen transitions occur, only the carry output, C, is enabled. When any more or less transitions occur, one or more of the Q0–Q3 outputs in counter C1 are enabled. If more or less than sixteen transitions occur, OR gate O1 outputs a high signal enabling the up and down outputs through AND gates A1 and A2, respectively. If the output of OR gate 01 is low, which occurs in a frequency locked condition, the outputs UP and DN are disabled.

Counter C2 is a six bit counter employed to count clock cycles in the depicted example. When forty cycles have been detected by counter C1, the outputs through Q0–Q5 are selected in such a manner that the output of AND gate A3 are high. This clocks D flip-flop D1. The input to D flip-flop D1 is a combination of an inverted output from OR gate 01 which is ANDed with the carry output C of counter C1 through AND gate A4. When a frequency locked condition occurs, this output from AND gate A4 is high. As a result, when D flip-flop D1 is clocked and its input D is high, its output Q also will go high indicating that a frequency locked condition occurs. When such a condition occurs sixteen consecutive times, the output of counter C3 also goes high and is latched by D flip-flop D2. The data is latched by counter C4 with its carry output C, which also acts to reset counters C3 and C4 after sensing forty bit times have occurred sixteen times.

Delay block 452 is used to delay the output from AND gate A3 to reset counters C1 and C2. Delaying of the signal from AND gate A3 allows for the outputs of counters C1, C2, or gate O1 and AND gate A3 to settle. The locked signal from D flip-flop D2 can be used as the enable phase detect signal in FIG. 3 to disable the frequency locked loop and enable the phase locked loop.

In FIG. 4, transition counter 450 is an illustration of one of a number of different types of circuits that may be used to count transitions. This particular example employs a positive edge counter to detect positive edge transitions. Other designs are possible depending upon the implementation. Transition counter 450 employs two inputs and three outputs in the depicted example. The two inputs are from the voltage controlled oscillator and the serial data stream. The number of clock cycles from the voltage controlled oscillator are compared to the number of transitions in the serial data stream. In the case of Fibre Channel technology, an idle primitive has sixteen positive and negative transitions repeating in a forty bit pattern. Thus, in the depicted example, transition counter 450 is designed to count forty clock cycles and check to see if sixteen transitions has occurred in this time frame.

Transition counter 450 includes three output signals in the depicted example. These signals are UP, DN, and LOCK. If the transition counter detects less than sixteen transitions within forty bit times, this indicates that the voltage controlled oscillator is operating at higher frequency than the incoming data. In this case, the DN output is active. An active DN signal will drain the charge from the loop filter causing a reduction in the frequency of the voltage controlled oscillator. If transition counter 450 detects more than sixteen transitions in a forty bit time frame, the UP output is active resulting in an increase in the charge of the loop filter, thus increasing the frequency of the voltage controlled oscillator.

If transition detector 450 senses exactly sixteen transitions within a forty bit time frame, the UP and DN outputs are disabled indicating that a frequency locked condition has occurred. In the depicted example, if transition counter 450 detects a locked condition for sixteen consecutive instances, the locked output is enabled. This locked output is enabled phase detect signal employed to disable transition counter 302 and charge pump 304 and enable phase detector 310 and charge pump 312 in FIG. 3 to disable the frequency locked loop and enable the phase locked loop. The locked output in the depicted example is configure to require more than one locked condition due to the closed loop dynamics which when underdamped will transition through a locked state several times before settling down into a real frequency locked condition.

Figure 5:
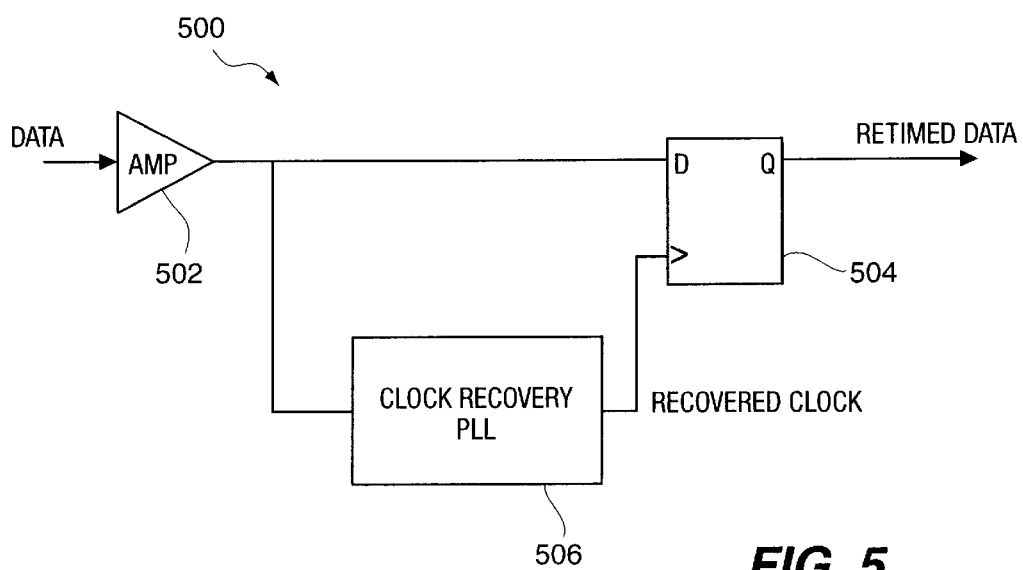
FIG. 5 is a functional block diagram of a repeater according to the present invention.

With reference now to FIG. 5, a functional block diagram of a repeater 500 is depicted according to the present invention. Repeater 500 includes an amplifier 502, a D flip-flop 504, and a clock recovery PLL 506. As can be seen, a reference clock is not required in repeater 500 because clock recovery PLL 506 may be implemented using a PLL such as PLL circuit 300 depicted in FIG. 3 according to the present invention. Data enters amplifier 502 and is sent to D flip-flop 504 and clock recovery PLL circuit 506. Clock recovery PLL circuit 506 provides a recovered clock signal used to re-time data output from D flip-flop 504. Initially, clock recovery PLL circuit 506 performs a phase and frequency lock using the idle characters in the incoming data amplified by amplifier 502. Then, clock recovery PLL circuit 506 then locks to the incoming serial data stream with the recovered clock re-timing serial data through D flip-flop 504.

Figure 1:
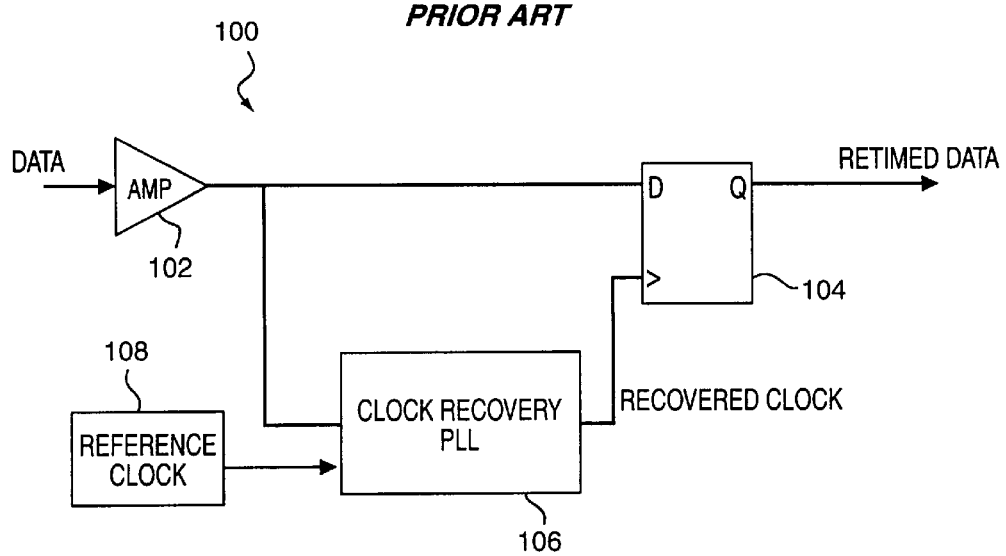
FIG. 1 is a block diagram of a repeater circuit known in the art.
Figure 6:
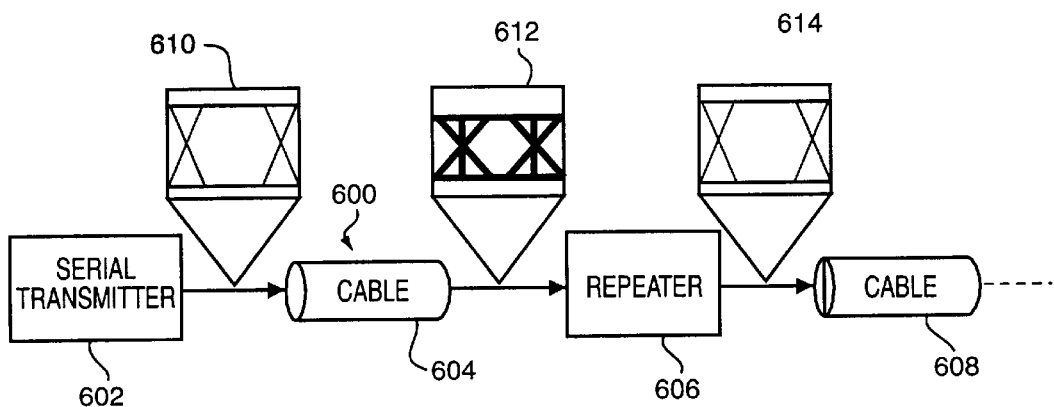
FIG. 6 is a block diagram of a communications link containing a repeater according to the present invention.

In FIG. 6, a block diagram of a repeater application and relative signals across a data link is depicted according to the present invention. Data link 600 includes a serial transmitter 602 having an output connected to cable 604. A repeater 606 is connected to the other end of cable 604 having an output connected to cable 608. Serial transmitter 602 drives data across cable 604. Eye diagram 610 at the input of cable 604 shows that the signal has very little jitter and a large amplitude. As the signal propagates through cable 604, the "eye" closes horizontally due to intersymbol interference (ISI) and vertically due to attenuation as can be seen in eye diagram 612. Repeater 606 is employed to remove much of the jitter caused by ISI and regenerates the amplitude of the signal as can be seen in eye diagram 614. This allows for the data to be transmitted across additional cable, such as cable 608.

Thus, the present invention provides an improved method and apparatus for recovering a clock signal without the need for a reference clock. Instead of using a reference clock, a data signal is employed to achieve a frequency lock in a frequency locked loop including a transition counter, a charge pump counter, a loop filter, and a voltage controlled oscillator. The transition counter is employed to count the number of transitions occurring in the data signal. By knowing the number of transitions required for a selected clock frequency, the transition counter can adjust the charge pump to alter the frequency of the output of the voltage controlled oscillator to achieve a frequency locked loop lock in the circuit.

In the depicted example, the transition counter counted the positive and negative transitions of an idle character. Those of ordinary skill in the art will realize that other types of data signals having a known number of transitions for a selected frequency may be employed according to the present invention. After a frequency lock occurs, a phase locked loop is employed to maintain a lock to the data. This phase locked loop includes a phase detector, a charge pump, the loop filter, and the voltage controlled oscillator. Thus, in this manner the present invention avoids the requirement of an external clock signal that is often provided by the use of the use of a crystal oscillator. In this manner, the present invention provides the advantage of reducing the complexity of the circuit and the cost of components required in manufacturing the circuit.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. An apparatus for generating a clock signal comprising;
   an input adapted for connection to a data source;
   phase detector means having an input adapted for connection to the data source;
   output means for generating a clock signal having a frequency;
   counter means connected to the output means for counting a number of transitions occurring within a time period in data received from the data source, wherein the counter means controls the frequency of the output means in response to the number of transitions occurring within a time period and
   enablement means connected to the counter means and the phase detector means for selectively enabling the counter means and the phase detector, wherein the counter means is enabled when the phase detector means is disabled and wherein the phase detector means is enabled when the counter means is disabled.

2. The apparatus of claim 1, wherein the enablement means initially enables the counter means and enables the phase detector means in response to a frequency lock to the data occurring in the clock signal.

3. The apparatus of claim 1, wherein the data source repeatedly transmits data in a form of idle characters having positive and negative transitions.

4. The apparatus of claim 1, wherein the data source transmits other data in place of the idle characters after a period of time.

5. The apparatus of claim 1, wherein the output means includes a voltage controlled oscillator.

6. The apparatus of claim 1, wherein the output means is connected to the counter means by charge pump and a loop filter.

7. The apparatus of claim 1, wherein the output means includes a loop filter and a voltage controlled oscillator.

8. The apparatus of claim 1, wherein the counter means is a transition counter.

9. A phase locked loop circuit comprising:
   a counter having first input, a second input, and an output, the first input being adapted for connection to a data source, wherein the counter counts transitions in data from the data source and compares the transitions to a frequency of an output signal;
   a phase detector having a first input, a second input, and an output, the first input being adapted for connection to the data source; and
   a voltage controlled oscillator having an input and an output, the input being connected to the output of the counter and the output of the phase detector and the output being connected to the second input in the counter and to the second input in the phase detector, wherein the voltage controlled oscillator generates the output signal having a frequency at the output of the voltage controlled oscillator and the frequency is controlled by the counter,
   wherein the counter and the voltage controlled oscillator form a frequency locked loop and the phase detector and voltage controlled oscillator form a phase locked loop and wherein the frequency locked loop is enabled while the phase locked loop is disabled and the frequency locked loop is disabled while the phase locked loop is enabled.

10. The phase locked loop circuit of claim 9 further comprising a control signal and wherein the counter and the phase detector are enabled and disabled such that the counter is enabled when the phase detector is disabled and the counter is disabled when the phase detector is enabled.

11. The phase locked loop circuit of claim 9, wherein the counter and the phase detector are connected to the voltage controlled oscillator by charge pump unit and a loop filter, wherein the charge pump unit has an input and an output, the input of the charge pump unit being connected to the output of the counter and the output of the phase detector and wherein the loop filter has an input and an output, the input of the loop filter being connected to the output of the charge pump and the output of the loop filter being connected to the input of the voltage controlled oscillator.

12. The phase locked loop circuit of claim 11, wherein the charge pump unit comprises a first charge pump having an input connected to the output of the counter and a second charge pump having an input connected to the output of the phase detector, wherein an output of the first charge pump and an output of the second charge pump are connected to the input of the loop filter.

13. The phase locked loop circuit of claim 12, wherein the first charge pump and the both charge pump are enabled and disabled by the control signal and wherein the first charge pump is enabled when the counter is enabled and the second charge pump is enabled when the phase detector is enabled.

14. The phase locked loop circuit of claim 9, wherein the data source repeatedly transmits data in a form of idle characters having positive and negative transitions.

15. The apparatus of claim 9, wherein the data source transmits other data in place of idle characters after a period of time.

16. A repeater circuit comprising:
   an amplifier having an input and an output, wherein the input is adapted for connection to a data signal and the output generates an amplified data signal;
   a flip-flop having a first input, a second input, and an output, wherein the first input is connected to the output of the amplifier and the output generates a data signal using the amplified data signal in response to a clock signal applied to the second input; and
   a phase locked loop circuit having an input connected to the output of the amplifier and an output connected to the second input of the flip-flop, the phase locked loop circuit comprising:
      a counter having a first input, a second input, and an output, the first input being adapted for connection to a data source, wherein the counter counts transitions in data from the data source and compares the transitions to a frequency of an output signal;
      a phase detector having a first input, a second input, and an output, the first input being adapted for connection to the data source;
      a voltage controlled oscillator having an input and an output, the input being connected to the output of the counter and to the output of the phase detector and the output being connected to the output of the phase locked loop circuit, to the second input in the counter, and to the second input in the phase detector, wherein the voltage controlled oscillator generates the output signal at the output,
      wherein the counter and the voltage controlled oscillator form a frequency locked loop and the phase detector and the voltage controlled oscillator form a phase locked loop and wherein the frequency locked loop is enabled while the phase locked loop is disabled and the frequency locked loop is disabled while the phase locked loop is enabled.

17. The repeater of claim 16, wherein the flip flop is a D flip-flop.

18. The repeater of claim 16, wherein the phase locked loop circuit is connected to a control signal and the counter and the phase detector are enabled and disabled using the control signal such that the counter is enabled when the phase detector is disabled and the counter is disabled when the phase detector is enabled.

19. The repeater of claim 16, wherein the counter and the phase detector in the phase locked loop circuit are connected to the voltage controlled oscillator by charge pump unit, wherein the charge pump unit has an input and an output, the input of the charge pump unit being connected to the output of the counter and to the output of the phase detector and the output of the charge pump unit being connected to the voltage controlled oscillator.

20. The repeater of claim 19, wherein the charge pump unit is connected to the voltage controlled oscillator by a loop filter.

21. The repeater of claim 20, wherein the charge pump unit includes two charge pumps.

22. A method for generating a clock signal in a voltage controlled oscillator, the method comprising:
receiving a data signal from a data source;
directing the data signal to a counter;
counting data transitions in the data signal;
adjusting a frequency of the clock signal from the voltage controlled oscillator based on the counted data transitions in the data signal during a period of time;
directing the data signal to a phase detector in response to an occurrence of a frequency lock in the clock signal, wherein directing the data signal is performed by controlled means connected to the counter and the phase detector such that the counter is enabled when the phase detector is disabled and the counter is disabled when the phase detector is enabled; and
adjusting the frequency of the clock signal from the voltage controlled oscillator using the phase detector in response to the directing of the data signal to the phase detector.

23. The method of claim 22, wherein the step of receiving a data signal includes receiving idle characters having positive and negative transitions.

* * * * *